United States Patent
Kawabe et al.

(10) Patent No.: US 8,651,699 B2
(45) Date of Patent: Feb. 18, 2014

(54) FLEXIBLE SUBSTRATE, MOUNTING METHOD OF FLEXIBLE SUBSTRATE, AND LIGHTING SYSTEM

(75) Inventors: Hideo Kawabe, Saitama (JP); Yoichi Toriumi, Tokyo (JP); Kenichi Kabasawa, Saitama (JP); Tatsuya Suzuki, Kanagawa (JP); Hirokazu Imai, Chiba (JP); Masatoshi Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 13/234,642

(22) Filed: Sep. 16, 2011

(65) Prior Publication Data
US 2012/0069584 A1 Mar. 22, 2012

(30) Foreign Application Priority Data

Sep. 22, 2010 (JP) .................. 2010-212395

(51) Int. Cl.
*F21S 4/00* (2006.01)

(52) U.S. Cl.
USPC .............................. 362/249.04; 362/249.02

(58) Field of Classification Search
USPC .................. 362/217.01, 219, 249.01, 249.02, 362/249.04, 249.08
See application file for complete search history.

(56) References Cited

FOREIGN PATENT DOCUMENTS

| JP | 2975893 | 4/2008 |
|---|---|---|
| JP | 2008-78066 | 9/2008 |

*Primary Examiner* — Vip Patel
(74) *Attorney, Agent, or Firm* — K&L Gates LLP

(57) ABSTRACT

A flexible substrate includes a stripe-shaped substrate main body portion; a comb-like portion composed of a plurality of protrusions that extends from one end in the direction perpendicular to the longitudinal direction of the substrate main body portion, in the direction perpendicular to the longitudinal direction; and electronic devices that are arranged on the plurality of protrusions, respectively, in which the substrate main body portion and the comb-like portion are bendable.

15 Claims, 8 Drawing Sheets

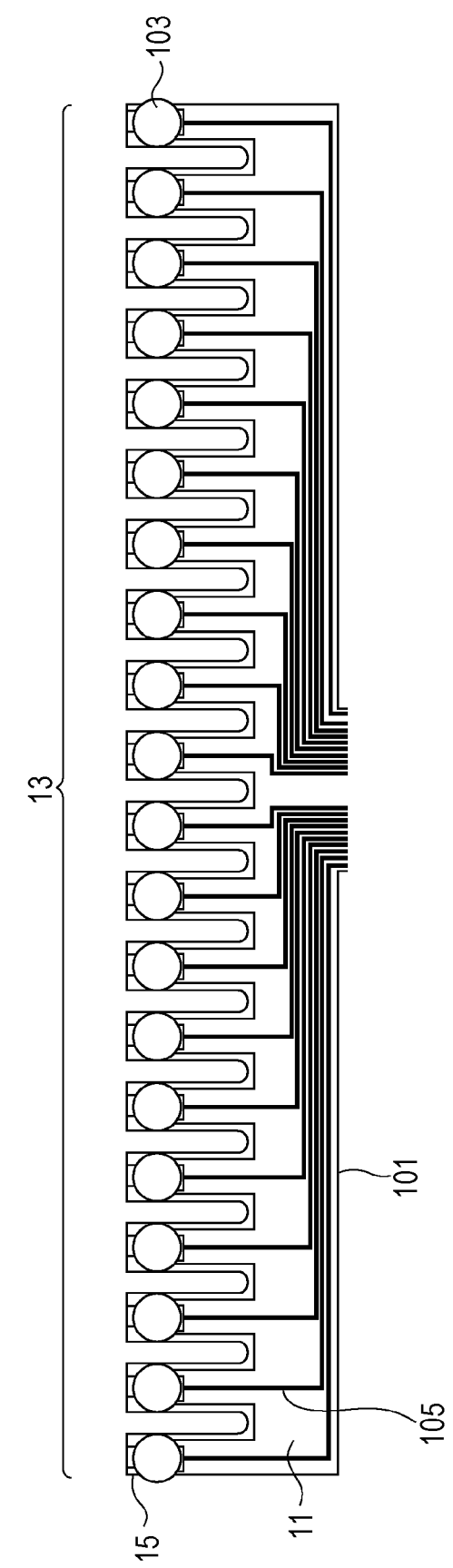

FLEXIBLE SUBSTRATE, MOUNTING METHOD OF FLEXIBLE SUBSTRATE, AND LIGHTING SYSTEM

CROSS REFERENCES TO RELATED APPLICATIONS

The present application claims priority to Japanese Priority Patent Application JP 2010-212395 filed in the Japan Patent Office on Sep. 22, 2010, the entire contents of which are hereby incorporated by reference.

BACKGROUND

The present application relates to a flexible substrate, a mounting method of a flexible substrate, and a lighting system.

In the related art, a so-called ring lighting system in which a plurality of LEDs (Light Emitting Diode) with small power consumption is disposed in a ring shape is used for lighting of a CCD camera in an image processing apparatus or lighting for observation in a microscope. In the ring lighting system, the LEDs are disposed around an object lens to radiate light from all directions or angles to an observation object such that an image is made easy to be observed by making shades of fine prominences and depressions on the surface of the observation object such that the contours appear.

A plurality of LEDs is disposed in a ring shape in manufacturing of the ring lighting system. Further, the LEDs may not be disposed only in the ring shape, but with inclination angles of generally 0° to 90° to radiate light to observation objects, in accordance with the surface condition of each of the observation objects. Therefore, it is necessary to mount LEDs on inclined surface with angles in the process of mounting light sources. In the related art, an effort for another mounting method different from mounting on common flat substrates is demanded for automatic equipment.

For this configuration, as a present general mounting method, for example, as disclosed in Japanese Patent No. 2975893, a C-shaped flexible substrate with a notch shaped and sized to fit to a conical surface of a ring-shaped part with the conical surface is prepared first. Thereafter, LEDs are mounted on the upper flat surface of the substrate and then the LEDs are disposed at predetermined angles and positions of a ring by bending the substrate to couple the notch of the substrate and attaching the substrate to the conical surface of the ring-shaped portion.

However, when the density of the mounted LEDs increases, the tips of the LEDs become smaller than the radius of curvature of the flexible substrate in curving, such that the LEDs interfere with each other and it is not easy to bend the flexible substrate. Further, the interference between the LEDs or bending the soldered joint of the printed substrate causes stress in the soldered joint. Accordingly, there is a problem in that cracks are generated in the soldered joint and bad electrical contact is generated.

In order to remove the bad electrical contact due to the cracks generated in the soldered joint, in Japanese Unexamined Patent Application Publication No. 2008-78066 described below, a structure having a specific structure has been proposed.

SUMMARY

However, when the method disclosed in Japanese Unexamined Patent Application Publication No. 2008-78066 is used, there is a problem in that the structures of the components and the manufacturing process are complicated and the manufacturing cost correspondingly increases.

Further, as a result of examining the technologies disclosed in Japanese Patent No. 2975893 and Japanese Unexamined Patent Application Publication No. 2008-78066, the inventors found a problem that positional accuracy of the mounted LEDs after assembling is bad in any one of the methods disclosed in Japanese Patent No. 2975893 and Japanese Unexamined Patent Application Publication No. 2008-78066. LEDs that are used in common ring lighting systems are so-called shell-shaped products with an integral structure of an LED chip and a lens. Electrical connection when the shell-shaped LED is mounted is achieved by inserting two wire type lead wires coming out from the LED main body into through-holes formed on the print substrate and soldering the lead wires. However, there is a problem in that when the lead wire is initially curved, the shell-shaped lens oscillates the head, and accordingly, the installation angle is not accurately determined.

In a lighting system for a CCD camera or for observation of a microscope in the related art, since accuracy in mounting is not much necessary, variation of position determination of the LED due to oscillation of the head described above is not a problem.

However, with the development in technology in recent years, a ring-shaped lighting system is necessary for new types of electronic devices that were not in the related art while it is necessary to radiate light to a desired area, with high positional accuracy.

The present disclosure has been made in consideration of the problems and it is desirable to provide a flexible substrate that makes it possible to accurately dispose an electronic device in a desired shape without complicating the structure of the components and the manufacturing process, a mounting method of a flexible substrate, and a lighting system.

According to an embodiment of the present disclosure, there is provided a flexible substrate including a stripe-shaped substrate main body portion; a comb-like portion composed of a plurality of protrusions that extends from one end in the direction perpendicular to the longitudinal direction of the substrate main body portion, in the direction perpendicular to the longitudinal direction; and electronic devices that are arranged on the plurality of protrusions, respectively, in which the substrate main body portion and the comb-like portion are bendable.

The electronic devices may be arranged in the direction perpendicular to the plate surface of the substrate main body portion.

A plurality of the electronic devices may be arranged at each of the protrusions in the longitudinal direction of the corresponding protrusions.

A wire pattern may be disposed on the surfaces of the substrate main body portion and the comb-like portion.

The electronic device may be at least any one selected from a group of a light emitting device, a transistor, a resistor, a condenser, a sensor, an oscillator, and an IC chip.

The substrate main body portion and the comb-like portion may be made of resin film, such as polyimide, PET, PEN, and PES.

Further, according to another embodiment of the disclosure, there is provided a mounting method of a flexible substrate, which includes a stripe-shaped substrate main body portion, a comb-like portion composed of a plurality of protrusions that extends from one end in the direction perpendicular to the longitudinal direction of the substrate main body portion, in the direction perpendicular to the longitudinal direction, and electronic devices that are arranged on the plurality of protrusions, respectively, in which the substrate main body portion and the comb-like portion are bendable. The method includes: bonding the substrate main body portion of the flexible substrate in the circumferential direction of a cylindrical portion of a chassis, which has the cylindrical portion and a conical portion connected to one end in the axial direction of the cylindrical portion and has a cross-section having a certain shape when the cylindrical portion is cut in the direction perpendicular to the axial direction, such that the comb-like portion faces the conical portion; and bending the protrusions of the comb-like portion along the conical surface of the conical portion.

The substrate main body portion of the flexible substrate may be bonded along the outer circumference of the cylindrical portion.

The substrate main body portion of the flexible substrate may be bonded along the inner circumference of the cylindrical portion.

A plurality of through-holes fitting to the shape of the electronic devices may be formed at the conical portion and the flexible substrate may be bonded to the chassis such that the electronic devices pass through the through-holes.

The conical portion may have a plurality of recessions fitting to the shapes of the electronic devices and the plurality of through-holes formed through the bottom of the recessions, and the flexible substrate may be bonded to the chassis such that the electronic devices are in contact with the bottoms of the recessions.

The comb-like portion may be pressed by an elastic member from the outside of the comb-like portion bent along the conical surface of the conical portion.

Further, according to still another embodiment of the present disclosure, there is provided a lighting system including a flexible substrate, which includes a stripe-shaped substrate main body portion, a comb-like portion composed of a plurality of protrusions that extends from one end in the direction perpendicular to the longitudinal direction of the substrate main body portion, in the direction perpendicular to the longitudinal direction, and electronic devices that are arranged on the plurality of protrusions, respectively, in which the substrate main body portion and the comb-like portion are bendable; and a chassis that has a cylindrical portion and a conical portion connected to one end in the axial direction of the cylindrical portion and has a cross-section having a certain shape when the cylindrical portion is cut in the direction perpendicular to the axial direction, in which the substrate main body portion of the flexible substrate is bonded in the circumferential direction of the cylindrical portion of the chassis such that the comb-like portion faces the conical portion while the protrusions of the comb-like portion are bonded along the conical surface of the conical portion.

The light emitting device may be a chip type light emitting diode, a plurality of recessions fitting to the shapes of the chip type light emitting diodes and a plurality of through-holes formed through the bottoms of the recessions may be formed at the conical portion, and the chip type light emitting diodes may be inserted in contact with the bottoms of the recessions.

The lighting system may further include an elastic member that presses the comb-like portion bonded along the conical surface of the conical portion, from the outside of the comb-like portion.

As described above, according to the embodiment of the present disclosure, it is possible to accurately dispose electronic devices in desired shapes without complicating the structures of components and the manufacturing process.

Additional features and advantages are described herein, and will be apparent from the following Detailed Description and the figures.

BRIEF DESCRIPTION OF THE FIGURES

FIG. 3 is an illustrative view showing an example of a flexible substrate according to the same embodiment;

DETAILED DESCRIPTION

Figure 1:
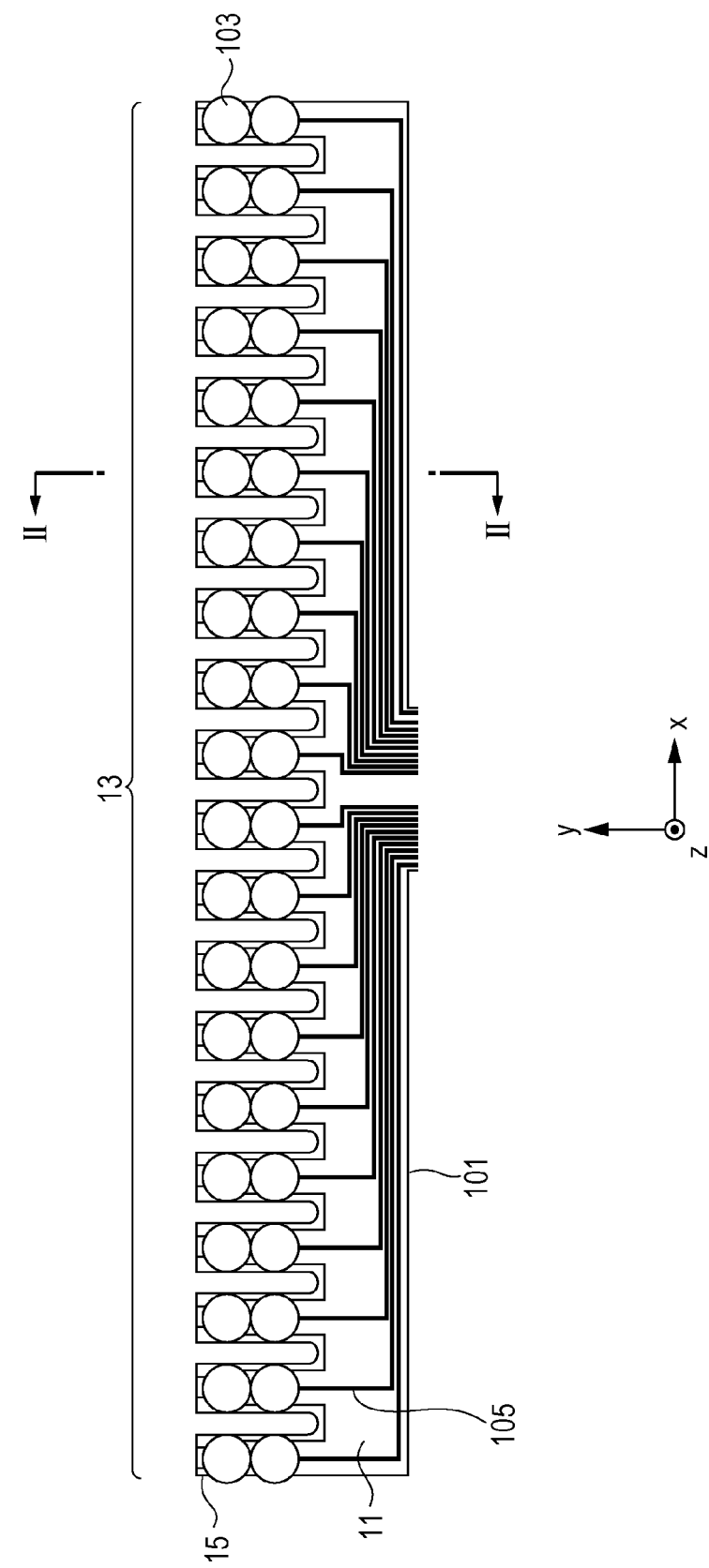
FIG. 1 is an illustrative view showing an example of a flexible substrate according to a first embodiment of the present disclosure.

Embodiments of the present application will be described below in detail with reference to the drawings.

Further, in the specification and the drawings, like reference numerals are given to components having substantially the same functional configuration and repetitive description is not provided.

Further, it is assumed that description is provided in the following order.

Figure 2:
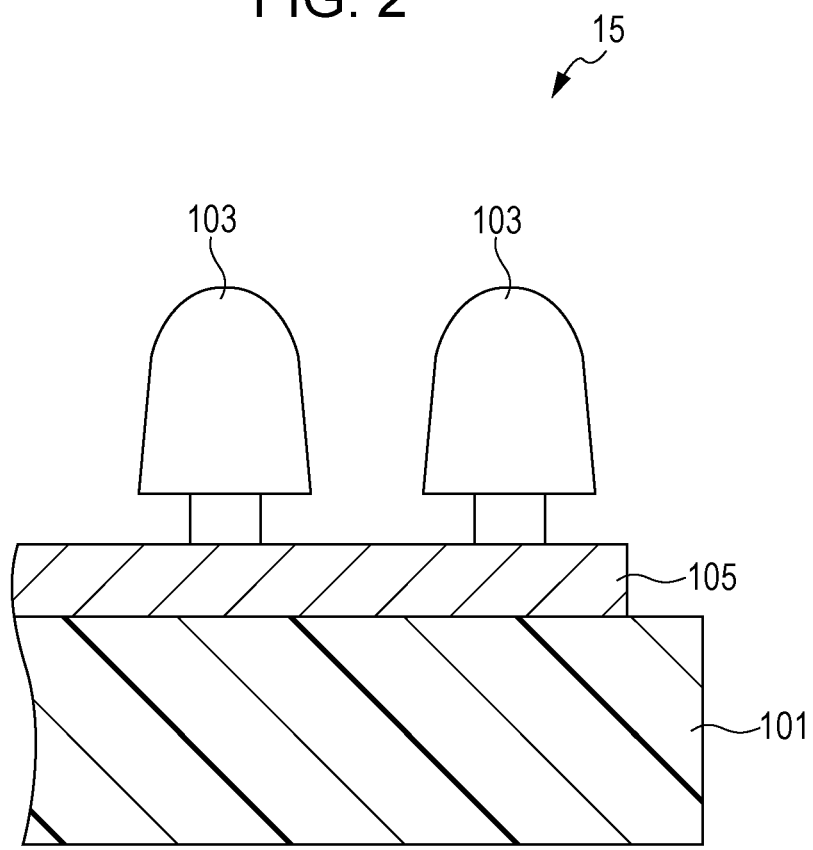
FIG. 2 is a cross-sectional view schematically showing a cross-section of FIG. 1 taken along the cutting line II-II.

(1) First Embodiment
(1-1) Flexible Substrate
(1-2) Mounting Method of Flexible Substrate
(1-3) Lighting System
(1-4) Application Example of Mounting Method of Flexible Substrate
(2) Conclusion First Embodiment Flexible Substrate First, a flexible substrate according to a first embodiment of the present disclosure is described in detail with reference to FIG. 1 and FIG. 2. FIG. 1 is an illustrative view showing an example of a flexible substrate according to the first embodiment and FIG. 2 is a cross-sectional view schematically showing a cross-section of the flexible substrate shown in FIG. 1, taken along the cutting line II-II.

As shown in FIG. 1, a flexible substrate 10 according to the embodiment is a substrate that has a substrate main body portion 11 and a comb-like portion 13 and of which the outer shape is a so-called a comb shape. In the flexible substrate 10, the substrate main body portion 11 and the comb-like portion 13 can be freely bent.

The substrate main body portion 11 is a stripe-shaped part of the flexible substrate 10. Further, a plurality of protrusions 15 extends in the y-axis direction at one end in the direction (y-axis direction) perpendicular to the longitudinal direction (x-axis direction in FIG. 1) of the substrate main body portion 11 and the plurality of protrusions 15 constitutes the comb-like portion 13. The comb-like portion 13 composed of the substrate main body portion 11 and the plurality of protrusions 15 is made of a base material 101, such as polyimide. The base material 101 used for the flexible substrate 10 according to the embodiment is not limited to polyimide, and a base material made of other resin, including resin film, such as PET, PEN, and PES, may be used.

One or a plurality of electronic devices 103 is mounted on each of the plurality of protrusions 15, as shown in FIG. 1, and a wire pattern 105 formed by a combination of longitudinal wires and transverse wires is disposed on the base material 101 corresponding to the substrate main body portion 11 and the comb-like portion 13.

In this configuration, the electronic devices 103 are arranged in lines in a direction in which the electronic devices 103 do not interfere with each other (that is, y-axis direction that is the longitudinal direction of the protrusion 15) when the flexible substrate 10 according to the embodiment is bent.

Further, as shown in FIG. 2, the electronic devices 103 arranged in the protrusions 15 are mounted in the direction perpendicular to the plate surface of the substrate main boy portion 11 (that is, z-axis direction in FIG. 1 and FIG. 2). In this configuration, the electronic devices 103 are mounted on the base material 101 that is horizontally placed, such that the electronic devices 103 can be very accurately mounted on the base material 101, in the flexible substrate 10 according to the embodiment. The electronic devices 103 are fixed on the base material 101 or the wire pattern 105 by soldering, an ACF (Anisotropic Conductive Film) bonding, or ultrasonic bonding or the like.

In the embodiment, for example, electronic components, such as light emitting devices, such as light emitting diodes (LEDs), transistors, resistors, condensers, various sensors, such as optical sensors, oscillators, and IC chips, may be exemplified as the electronic devices 103 mounted on the protrusions 15 according to the embodiment. Further, the electronic components that can be mounted on the protrusions 15 according to the embodiment are not limited to the example described above and other certain electronic components may be mounted.

Further, in the flexible substrate 10 according to the embodiment, since the wire shape of the wire pattern 105 can be implemented by the combination of the longitudinal wires and the transverse wires, it is not necessary to use a curved pattern that fits to the shape of a substrate (for example, a substantially C-shaped substrate), as in the related art. Therefore, in the flexible substrate 10 according to the embodiment, it is possible to manufacture a wire pattern having a small pitch and high accuracy on the flexible substrate 10.

Further, since the flexible substrate 10 according to the embodiment is composed of the stripe-shaped substrate main body portion 11 and the comb-like portion 13 protruding from the substrate main body portion 11, a simple outer shape is implemented as compared with flexible substrates in the related art. Accordingly, even if a base material made of polyimide or the like of which the material price is high is used, effective punching from the base material is possible, such that more flexible substrates 10 can be taken from one base material. Therefore, it is possible to keep the manufacturing cost of the flexible substrate lower than the related art.

The configuration of the flexible substrate 10 according to the first embodiment of the present disclosure was described above in detail with reference to FIG. 1 and FIG. 2.

Mounting Method of Flexible Substrate

Next, a method of mounting the flexible substrate 10, as shown in FIG. 1 and FIG. 2, is described.

Since the flexible substrate 10 according to the embodiment has a cylindrical portion and a conical portion connected to one end in the axial direction of the cylindrical portion, the cross-section when a cylindrical portion is cut in the direction perpendicular to the axial direction can be preferably mounted on a chassis having a certain shape. In other words, a case where the flexible substrate 10 according to the embodiment can be preferably mounted is a ring-shaped structure having a cylindrical portion and a certain ring-shaped conical portion, such as a ring shape, an elliptical ring shape, and polygonal ring shape in a combined manner.

In the mounting method of a flexible substrate according to the embodiment, first, as shown in FIG. 1, the substrate main body portion 11 of the flexible substrate 10 is bonded around the cylindrical portion in the ring-shaped structure. In this process, the arrangement direction of the flexible substrate 10 is set such that the comb-like portion 13 of the flexible substrate 10 faces the conical shape of the ring-shaped structure.

Thereafter, the protrusions 15 of the flexible substrate 10 shown in FIG. 1 are bent along the conical portion of the ring-shaped structure and the protrusions 15 are bonded to cover the conical surface of the ring-shaped structure.

In the flexible substrate 10 according to the embodiment, as shown in FIG. 1, the base material 101 of the flexible substrate does not exist between the adjacent protrusions 15. Accordingly, restriction by the substrate between the electronic devices 103 can be weakened, such that stress in the joints (joints between the electronic devices and the base material) due to positional deviation of the electronic device 103 can be reduced. Therefore, even if there is mechanical and physical interference due to variation in head oscillation of the electronic devices 103 (for example, LEDs) when the flexible substrate 10 is bent, the gap of the comb-like portion 13 increases or decreases, such that the stress in the joints can be removed.

Further, according to a ring-shaped structure having a certain cross-sectional shape, by using the flexible substrate 10 according to the embodiment, it is possible to mount the flexible substrate on the structure without designing the shape of an exclusive flexible substrate according to the radius of the circular ring or the angle of the conical surface.

As described above, the mounting method of a flexible substrate according to the embodiment is a mounting method using a flexible printed substrate having a flat shape, which is advantageous in automatic mounting that uses mounting apparatuses of the existing infrastructure. It is possible to achieve both high mounting positional accuracy and high reliability by using the mounting method of a flexible substrate according to the embodiment.

Further, the order of bonding the substrate main body portion 11 of the flexible substrate 10 to the cylindrical portion of the ring-shaped structure and then bonding the comb-like portion 13 of the flexible substrate 10 to the conical surface of the ring-shaped structure was described in the above. However, the mounting method of a flexible substrate according to the embodiment is not limited to the order described above, and the comb-like portion 13 of the flexible substrate 10 may be bonded to the conical surface of the ring-shaped structure and then the substrate main body portion 11 of the flexible substrate 10 may be bonded to the cylindrical portion of the ring-shaped structure. Further, the substrate main body portion 11 of the flexible substrate 10 and the comb-like portion 13 may be simultaneously bonded to the ring-shaped structure.

Lighting System

Next, a mounting method of a flexible substrate according to the embodiment is described in detail by exemplifying when a lighting system is manufactured by using the flexible substrate 10 where LEDs are mounted as the electronic devices 103.

EXAMPLE 1 of Lighting System

Hereinafter, as shown in FIG. 3, manufacturing a lighting system in which LEDs are disposed in a ring shape on the conical surface of a ring-shaped structure by using the flexible substrate 10 where one so-called shell-shaped LED is mounted on each of the protrusion 15 is described in detail with reference to FIG. 4A to FIG. 4D. FIG. 3 is an illustrative view showing an example of a flexible substrate according to the embodiment. FIG. 4A to FIG. 4D are illustrative views showing an example of a lighting system according to the embodiment.

Figure 4A:
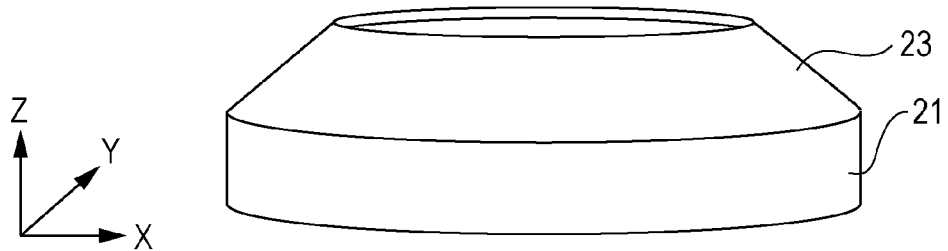
FIG. 4A is an illustrative view showing an example of a lighting system according to the same embodiment.

The chassis 20 where the flexible substrate 10 shown in FIG. 3 is mounted, as shown in FIG. 4A, has a cylindrical portion 21 having a circular cross-section on the XY-plane and a conical portion 23 having a cone shape and disposed on the end of the Z-axis direction of the cylindrical portion 21. The chassis 20 may be made of a certain material, such as plastic resin.

Figure 4B:
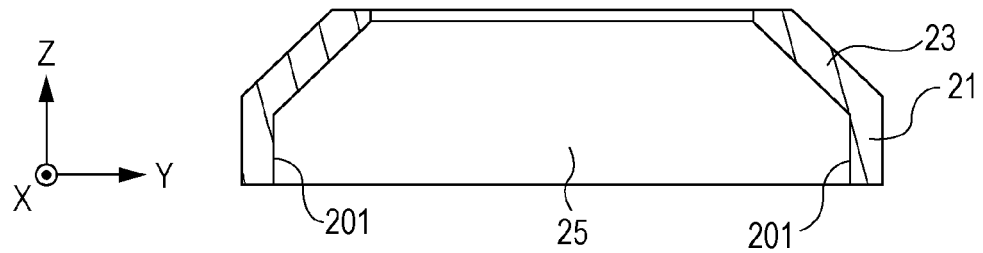
FIG. 4B is an illustrative view showing an example of a lighting system according to the same embodiment.

Further, FIG. 4B is a cross-sectional view when the chassis 20 shown in FIG. 4A is cut in the Z-axis direction, but the inside of the chassis 20 according to the embodiment is empty, as shown in FIG. 4B. Light is radiated toward the empty portion 25 from the LEDs mounted on the flexible substrate 10.

Figure 4C:
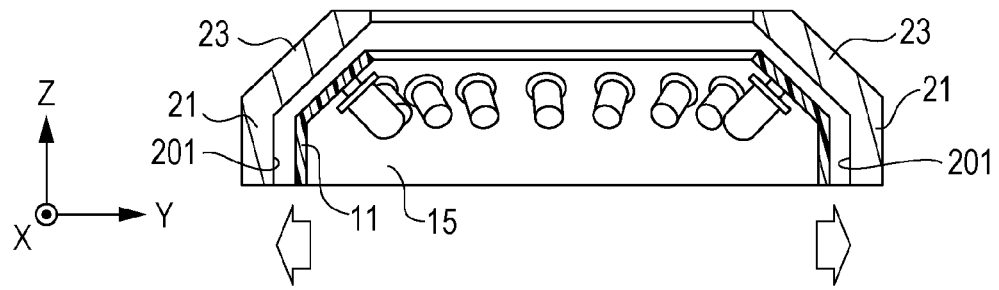
FIG. 4C is an illustrative view showing an example of a lighting system according to the same embodiment.

FIG. 4C is an illustrative view showing an example of a mounting method of the flexible substrate 10 on the chassis 20 shown in FIG. 4A. As shown in FIG. 4C, the flexible substrate 10 according to the embodiment is mounted along the inner wall 201 of the chassis 20. That is, the substrate main body portion 11 of the flexible substrate 10 is bonded to the inner wall 201 corresponding to the portion of the cylindrical portion 21 of the chassis 20 and the protrusions 15 of the flexible substrate 10 are curvedly bonded along the inner wall 201 corresponding to the portion of the conical portion 23 of the chassis 20. In this structure, the flexible substrate 10, as shown in FIG. 4C, is arranged in the empty portion 25 with the LEDs toward the empty portion 25 of the chassis 20.

Figure 4D:
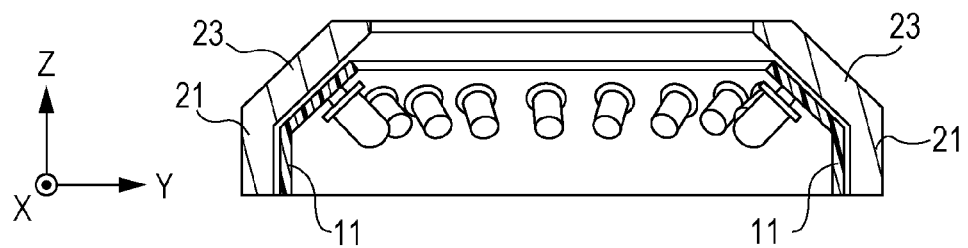
FIG. 4D is an illustrative view showing an example of a lighting system according to the same embodiment.

Accordingly, the flexible substrate 10 is mounted inside the chassis 20 and the lighting system shown in FIG. 4D is manufactured. According to the lighting system shown in FIG. 4D, the LEDs mounted on the flexible substrate 10 are arranged in a ring shape at the angle corresponding to the conical surface of the chassis 20, such that light emitted from all of the LEDs can be radiated to desired positions at desired angles. That is, a lighting system manufactured by using the mounting method of a flexible substrate according to the embodiment can freely change the irradiation angle of light emitted from the LEDs by changing the angle of the conical surface of the chassis 20.

EXAMPLE 2 of Lighting System

Figure 5A:
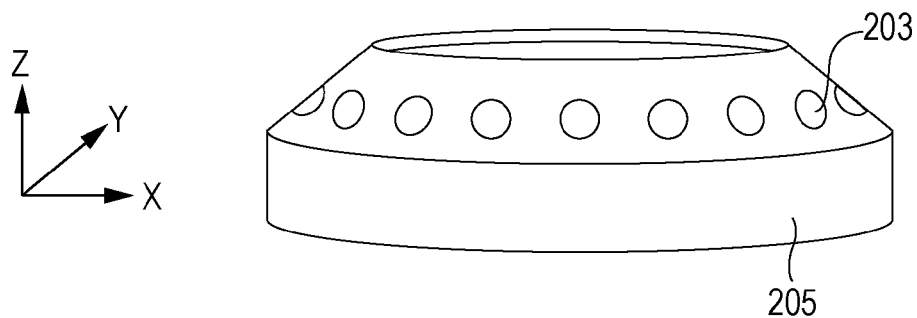
FIG. 5A is an illustrative view showing an example of a lighting system according to the same embodiment.
Figure 5B:
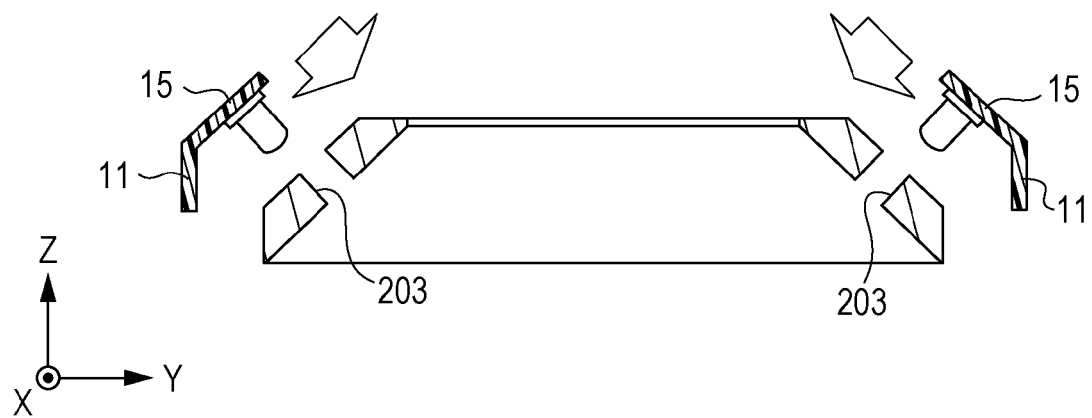
FIG. 5B is an illustrative view showing an example of a lighting system according to the same embodiment.
Figure 5C:
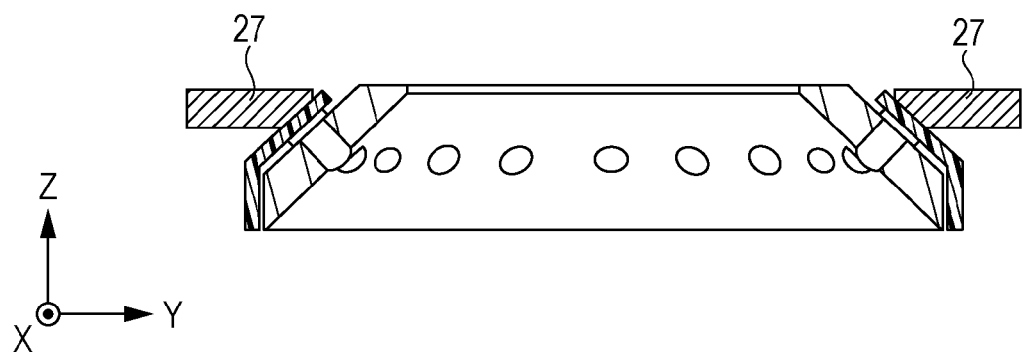
FIG. 5C is an illustrative view showing an example of a lighting system according to the same embodiment.

In Example 1 of a lighting system described above, the flexible substrate 10 shown in FIG. 3 is mounted inside the chassis 20. Example 2 of a lighting system that is described below with reference to FIG. 5A to FIG. 5C is manufactured by mounting the flexible substrate 10 shown in FIG. 3 along the outer circumference of the chassis 20. In order to implement the lighting system, in the conical portion 23 of the chassis 20, through-holes, an embossing shape, or a flat plane shape is provided at the portion corresponding to the LEDs and the LEDs area mounted at the portions of the through-holes, embossing shape, or flat plane shape.

In the example shown in FIG. 5A to FIG. 5C, when through-holes are formed at the conical portion 23 of the chassis 20 and so-called shell-shaped LEDs are mounted is described. FIG. 5A to FIG. 5C are illustrative views showing an example of a lighting system according to the embodiment.

In the conical portion 23 of the chassis 20 of the embodiment, through-holes 203 fitting to the shape of the LEDs are formed at the portions corresponding to the LEDs. The through-holes 203 are arranged in a ring shape, as shown in FIG. 5A, at the angles where the mounted LEDs are arranged at desired light irradiation angles.

In this case, the flexible substrate 10 shown in FIG. 3 is mounted along the outer wall of the chassis 20. That is, the substrate main body portion 11 of the flexible substrate 10 is, as shown in FIG. 5B, bonded to the outer wall corresponding to the portion of the cylindrical portion 21 of the chassis 20 and the protrusions 15 of the flexible substrate 10 are curvedly bonded along the conical surface of the conical portion 23 such that the LEDs are inserted in the through-holes 203 formed at the conical portion 23.

Accordingly, the flexible substrate 10 is mounted along the outer circumference of the chassis 20, such that the lighting system shown in FIG. 5C is manufactured. According to the lighting system shown in FIG. 5C, the LEDs mounted on the flexible substrate 10 are inserted in the through-holes formed at the conical surface of the chassis 20, such that light emitted from all of the LEDs can be radiated to desired positions at the angles of the through-holes. As shown in FIG. 5C, it is possible to mechanically and physically regulate the positions and the mounting angles of the LEDs by inserting the LEDs in the through-holes 203. As a result, it is possible to further improve accuracy of the mounting positions of the LEDs on the chassis 20, such that it is possible to more accurately regulate the light irradiation angles.

Further, as shown in FIG. 5C, the comb-like portion 13 composed of the plurality of protrusions 15 bonded along the conical surface of the conical portion 23 may be pressed by an elastic member 27 from the outside of the comb-like potion 23 (that is, from behind the portion where the LEDs are mounted). With this configuration, it is possible to further prevent the LEDs inserted in the through-holes 203 from rattling, such that it is possible to further improve accuracy in position determination of the LEDs. As the elastic member 27, for example, rubber, a spring, and a leaf spring may be exemplified, which may be appropriately selected, depending on how degree of force presses the comb-like portion 13.

Example 3 of Lighting System

Figure 6:
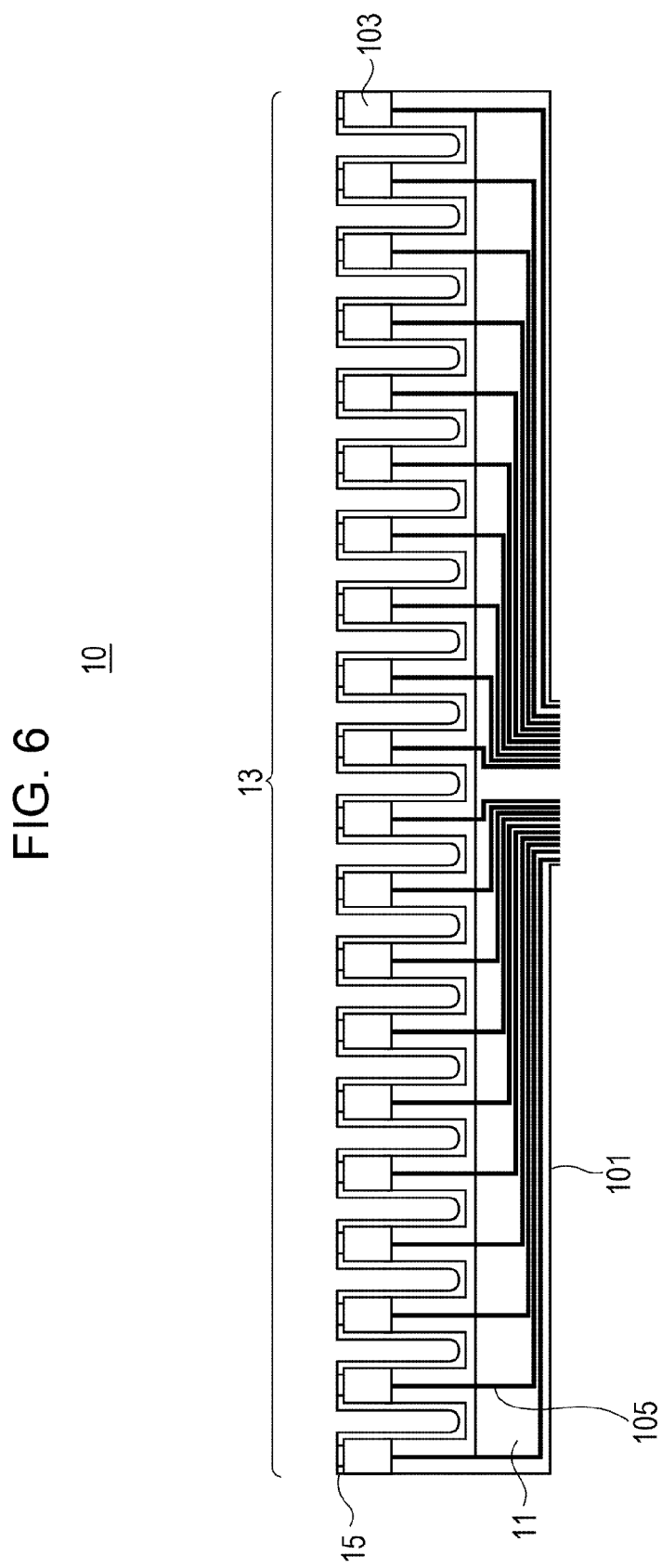
FIG. 6 is an illustrative view showing an example of a flexible substrate according to the same embodiment.

Further, as shown in FIG. 6, it may be possible to manufacture a lighting system, using the flexible substrate 10 where so-called chip type LEDs are mounted as the electronic devices 103. When the chip type LEDs are mounted on the chassis 20, for example, by using solder cream, so-called a self alignment effect is achieved in a process of baking the solder cream. As a result, it is possible to perform position determination of the LEDs with higher accuracy, as compared with using so-called shell-shaped LEDs. Hereinafter, a lighting system that is manufactured by using a flexible substrate where chip type LEDs are mounted is described with reference to FIG. 7A to FIG. 7C.

Figure 7A:
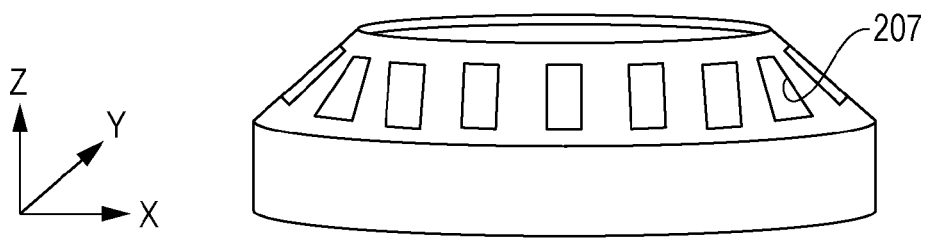
FIG. 7A is an illustrative view showing an example of a lighting system according to the same embodiment.
Figure 7B:
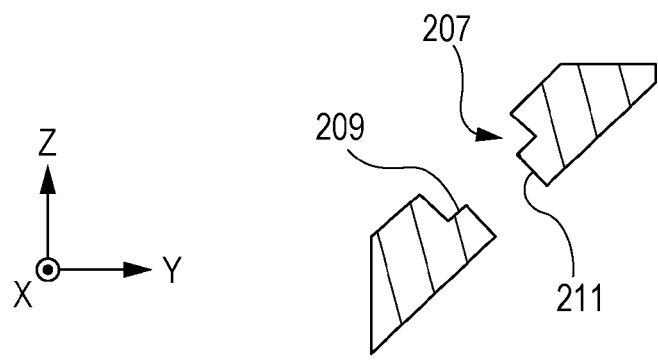
FIG. 7B is an illustrative view showing an example of a lighting system according to the same embodiment.

As shown in FIG. 6, when the flexible substrate 10 where chip type LEDs are mounted is used, in the conical portion 23 of the chassis 20, as shown in FIG. 7A, recessions 207 fitting to the outer shapes of corresponding LEDs are formed in a ring shape at the portions corresponding to the chip type LEDs. Further, although FIG. 7B shows an enlarged cross-section of a recession 207, as shown in this figure, a through-hole 211 is formed through the bottom 209 of the recession 207 formed at the conical portion 23, such that the light emitted from the LED mounted in the recession 207 can travel through the empty portion 25 of the chassis 20. Further, an optical member, such as an optical lens or an optical filter, may be disposed at the end, close to the empty portion 25, of the through-hole 211.

In this case, the flexible substrate 10 shown in FIG. 6 is mounted along the outer wall of the chassis 20. That is, the substrate main body portion 11 of the flexible substrate 10 is, as shown in FIG. 7C, bonded to the outer wall corresponding to the portion of the cylindrical portion 21 of the chassis 20 and the protrusions 15 of the flexible substrate 10 are curvedly bonded along the conical surface of the conical portion 23 such that the LEDs are in contact with the bottoms 209 of the recessions 207 formed in the conical portion 23.

Figure 7C:
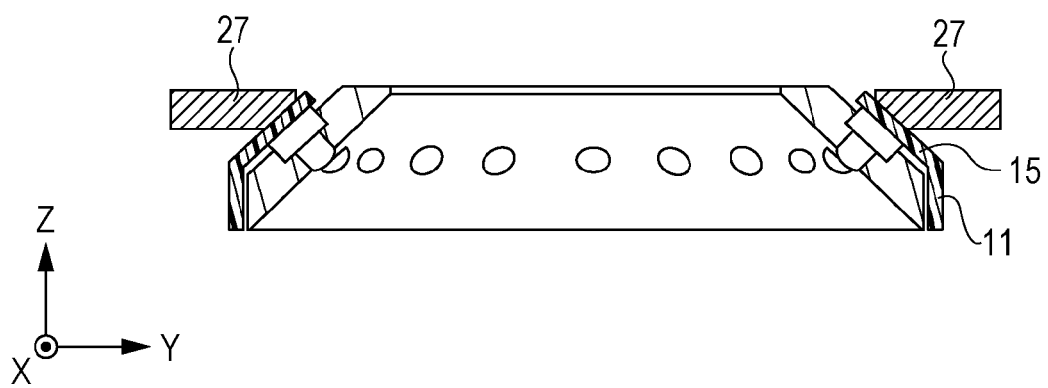
FIG. 7C is an illustrative view showing an example of a lighting system according to the same embodiment.

According to the lighting system shown in FIG. 7C, the chip type LEDs mounted on the flexible substrate 10 are in contact with the bottoms 209 of the recessions 207 formed on the conical surface of the chassis 20, such that light emitted from all of the LEDs can be radiated to desired positions at the angles of the through-holes. As shown in FIG. 7C, it is possible to regulate the angles of the chip type LEDs by inserting the chip type LEDs to be in contact with the bottoms 209 of the recessions 207, such that it is possible to implement a lighting system with higher accuracy.

Further, as shown in FIG. 7C, even in the embodiment, the comb-like portion 13 composed of the plurality of protrusions 15 bonded along the conical surface of the conical portion 23 may be pressed by an elastic member 27 from the outside of the comb-like potion 23 (that is, from behind the portion where the LEDs are mounted). With this configuration, it is possible to further prevent the LEDs inserted in the through-holes 203 from rattling, such that it is possible to further improve accuracy in position determination of the LEDs.

In the lighting systems of the first to third examples described above, a flexible substrate 10 in which one LED is disposed on each of the protrusions 15 was used. Therefore, the LEDs were arranged in one ring shape on the conical portion 23 of the chassis 20 in the lighting systems of the first to third examples. However, it is possible to change the number of the LEDs layered in a ring shape, on the conical portion 23 of the chassis 20, by increasing the number of LEDs that are mounted on each of the protrusions 15 of the flexible substrate 10.

A lighting system that can be manufactured by using the mounting method of a flexible substrate according to the embodiment was described above in detail with reference to FIG. 3 to FIG. 7C.

Application of Mounting Method of Flexible Substrate

In the lighting systems described above, the chassis 20 is formed as a structure having a combination of the column-shaped cylindrical portion 21 and the cone-shaped conical portion 23, but the chassis 20 may be a structure having a combination of prism-shaped cylindrical portion 21 and a pyramid-shaped conical portion 23. Further, other than the circular or rectangular shape, an elliptical shape or a polygonal shape may be possible, and a certain shape is possible for ring-shaped structures having a conical surface.

Figure 8:
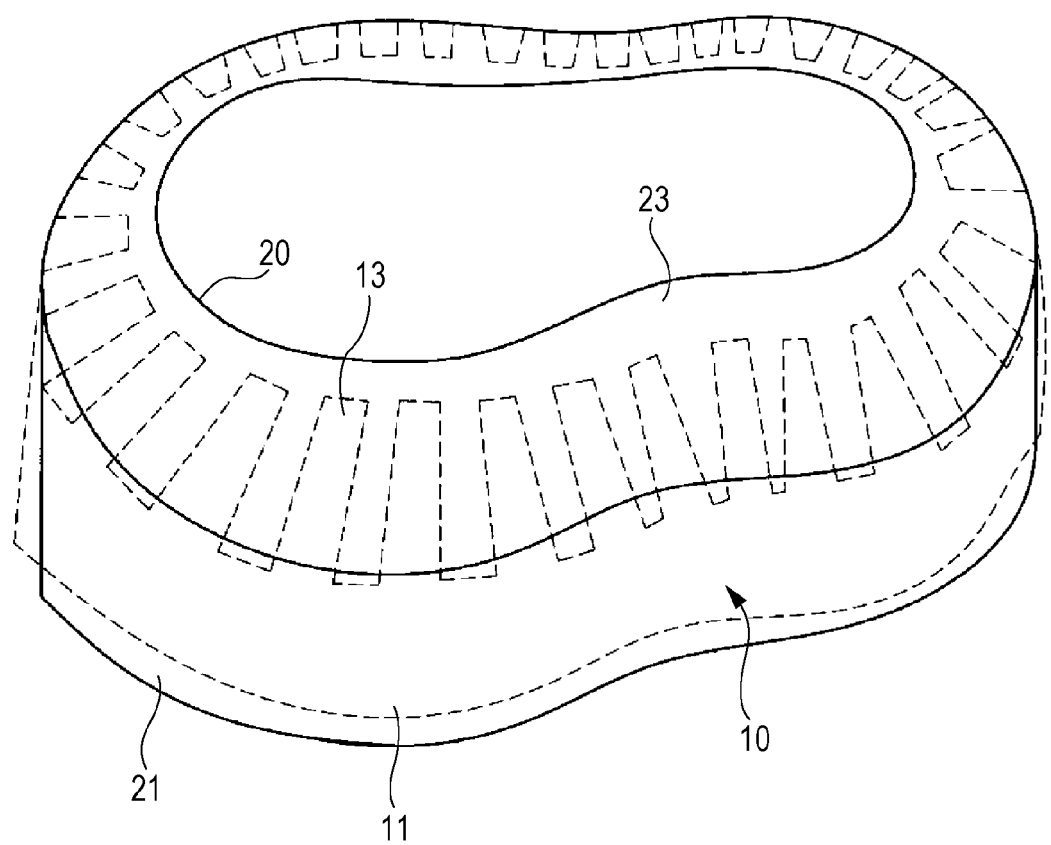
FIG. 8 is an illustrative view showing an application example of a mounting method of flexible substrate according to the same embodiment.

Hereinafter, mounting the flexible substrate 10 according to the embodiment is briefly described, for a ring-shaped structure of which the cylindrical portion has a certain shape and the angle of the conical surface is not uniform, as shown in FIG. 8.

In the flexible substrate 10 according to the embodiment, for example, as shown in FIG. 1, electronic devices, such as LEDs, are arranged on the protrusions 15 that extend from the substrate main body portion 11. Accordingly, it is possible to adjust the curved degree when bonding along the conical surface of the chassis to the protrusions 15, such that it is possible to easily arrange electronic devices even in a ring-shaped structure in which the angle of the conical surface is not uniform, as shown in FIG. 8.

For example, in a ring-shaped structure having a free shape, as shown in FIG. 8, it is possible to implement a lighting system that can radiate light in all directions, for an area having a certain shape (empty portion) by mounting the flexible substrate 10 where the LEDs are arranged, for example.

According to the lighting system shown in FIG. 8, it is possible to use the lighting system to harden a UV hardening adhesive in an area having a certain shape, for example, by mounting LEDs that can radiate ultraviolet rays and radiating ultraviolet rays to the area.

CONCLUSION

As described above, according to embodiments of the present disclosure, there is provided a flexible substrate that has a stripe-shaped substrate main body portion and a comb-like portion composed of a plurality of protrusions extending from the substrate main body portion and includes electronic devices, such as LEDs, mounted on the protrusions. By using the flexible substrate, it is possible to implement ring-shaped conical surface mounting with high reliability, without causing mechanical stress in the electrical joints of the electronic devices mounted on a base material of the substrate by soldering, ACF bonding, ultrasonic bonding, or the like.

Further, in the flexible substrate according to the embodiments of the present disclosure, the electronic devices are mounted on the protrusions of the comb-like portion. Therefore, for a ring-shaped structure having not only a circular ring shape, but elliptical, polygonal, or the like, or a certain shape, it is possible to mount electronic devices on the conical surface of the structure, using a flexible substrate having the same shape as that shown in FIG. 1 and the like. Further, even in a structure in which the angle of the conical surface becomes different by the position of the ring shape, it is possible to mount electronic devices on the conical surface of the structure, using the flexible substrate according to the embodiments of the present disclosure.

Further, since the shape of the flexible substrate according to the embodiments of the present disclosure is simpler than flexible substrates of the related art, it is possible to increase the number of pieces taken from one sheet of film even when using polyimide film of which the material price is high as the base material. As a result, it is possible to restrain the cost for manufacturing the flexible substrate.

Further, it is possible to implement accurate positions and angles of the electronic devices on the ring-shaped conical surface by using the flexible substrate 10. As a result, a lighting system in which, for example, LEDs are mounted as electronic devices is manufactured, it is possible to restrain non-uniformity in two-dimensional luminance for a light-emitted area. Further, it is possible to manufacture a ring-shaped lighting system having high-accuracy irradiation performance in an inexpensive price by mounting LEDs on a ring-shaped structure, by using the mounting method of a flexible substrate according to the embodiments of the present disclosure.

Although preferred embodiments of the present disclosure were described above in detail with reference to the accompanying drawings, the present disclosure is not limited to the examples. It is apparent that those skilled in the art can modify and change the present disclosure in various ways within the scope described in claims and it should be understood that the modifications and changes are included in the scope of the present disclosure.

For example, although it was described in the embodiments that the same kinds of electronic devices (for example, LEDs) are mounted on the protrusions of the flexible substrate 10, the kinds of electronic devices mounted on the protrusions may depend on the protrusions. Further, although when the lengths of the protrusions of the flexible substrate 10 are the same as shown in the embodiment, the lengths of the protrusions may be changed within the flexible substrate 10.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A flexible substrate comprising:
    a stripe-shaped substrate main body portion;
    a comb-like portion composed of a plurality of protrusions that extends from one end in the direction perpendicular to the longitudinal direction of the substrate main body portion, in the direction perpendicular to the longitudinal direction; and
    electronic devices that are arranged on the plurality of protrusions, respectively,
    wherein the substrate main body portion and the comb-like portion are bendable.

2. The flexible substrate according to claim 1,
    wherein the electronic devices are arranged in the direction perpendicular to the plate surface of the substrate main body portion.

3. The flexible substrate according to claim 1,
    wherein a plurality of the electronic devices is arranged at each of the protrusions in the longitudinal direction of the corresponding protrusions.

4. The flexible substrate according to claim 1,
    wherein a wire pattern is disposed on the surfaces of the substrate main body portion and the comb-like portion.

5. The flexible substrate according to claim 1,
    wherein the electronic device is at least any one selected from a group of a light emitting device, a transistor, a resistor, a condenser, a sensor, an oscillator, and an IC chip.

6. The flexible substrate according to claim 1,
    wherein the substrate main body portion and the comb-like portion are made of resin film, such as polyimide, PET, PEN, and PES.

7. A mounting method of a flexible substrate, which includes a stripe-shaped substrate main body portion, a comb-like portion composed of a plurality of protrusions that extends from one end in the direction perpendicular to the longitudinal direction of the substrate main body portion, in the direction perpendicular to the longitudinal direction, and electronic devices that are arranged on the plurality of protrusions, respectively, in which the substrate main body portion and the comb-like portion are bendable,
    the method comprising:
    bonding the substrate main body portion of the flexible substrate in the circumferential direction of a cylindrical portion of a chassis, which has the cylindrical portion and a conical portion connected to one end in the axial direction of the cylindrical portion and has a cross-section having a certain shape when the cylindrical portion is cut in the direction perpendicular to the axial direction, such that the comb-like portion faces the conical portion, and
    bending the protrusions of the comb-like portion along the conical surface of the conical portion.

8. The method according to claim 7,
    wherein the substrate main body portion of the flexible substrate is bonded along the outer circumference of the cylindrical portion.

9. The method according to claim 7,
    wherein the substrate main body portion of the flexible substrate is bonded along the inner circumference of the cylindrical portion.

10. The method according to claim 8,
    wherein a plurality of through-holes fitting to the shape of the electronic devices is formed at the conical portion and the flexible substrate is bonded to the chassis such that the electronic devices pass through the through-holes.

11. The method according to claim 8,
    wherein the conical portion has a plurality of recessions fitting to the shapes of the electronic devices and the plurality of through-holes formed through the bottom of the recessions, and
    the flexible substrate is bonded to the chassis such that the electronic devices are in contact with the bottoms of the recessions.

12. The method according to claim 10,
    wherein the comb-like portion is pressed by an elastic member from the outside of the comb-like portion bent along the conical surface of the conical portion.

13. A lighting system comprising:
    a flexible substrate, which includes a stripe-shaped substrate main body portion, a comb-like portion composed of a plurality of protrusions that extends from one end in the direction perpendicular to the longitudinal direction of the substrate main body portion, in the direction perpendicular to the longitudinal direction, and electronic devices that are arranged on the plurality of protrusions, respectively, in which the substrate main body portion and the comb-like portion are bendable; and
    a chassis that has a cylindrical portion and a conical portion connected to one end in the axial direction of the cylindrical portion and has a cross-section having a certain shape when the cylindrical portion is cut in the direction perpendicular to the axial direction, wherein the substrate main body portion of the flexible substrate is bonded in the circumferential direction of the cylindrical portion of the chassis such that the comb-like portion faces the conical portion while the protrusions of the comb-like portion are bonded along the conical surface of the conical portion.

14. The lighting system according to claim 13,
wherein the light emitting device is a chip type light emitting diode,
a plurality of recessions fitting to the shapes of the chip type light emitting diodes and a plurality of through-holes formed through the bottoms of the recessions are formed at the conical portion, and
the chip type light emitting diodes are inserted so as to be in contact with the bottoms of the recessions.

15. The lighting system according to claim 13, further comprising an elastic member that presses the comb-like portion bonded along the conical surface of the conical portion, from the outside of the comb-like portion.

* * * * *